US009721612B2

United States Patent
Lehtiniemi et al.

(10) Patent No.: US 9,721,612 B2
(45) Date of Patent: Aug. 1, 2017

(54) METHOD AND APPARATUS FOR PROVIDING CONTENT LISTS USING CONNECTING USER INTERFACE ELEMENTS

(75) Inventors: Arto Juhani Lehtiniemi, Lempaala (FI); Juha Henrik Arrasvuori, Tampere (FI); Antti Johannes Eronen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 13/433,952

(22) Filed: Mar. 29, 2012

(65) Prior Publication Data

US 2013/0263049 A1 Oct. 3, 2013

(51) Int. Cl.
*H04H 60/04* (2008.01)
*H04L 29/08* (2006.01)
(Continued)

(52) U.S. Cl.
CPC .......... *G11B 27/034* (2013.01); *G06F 3/0481* (2013.01); *G06F 3/0236* (2013.01); *G06F 3/0238* (2013.01); *G06F 3/0482* (2013.01); *G06F 3/0486* (2013.01); *G06F 3/04883* (2013.01); *G06F 3/04886* (2013.01);
(Continued)

(58) Field of Classification Search
CPC ............... H04H 60/04; H04H 5/44543; H04N 5/44543; G11B 20/10527; G11B 27/34; G11B 27/028; G11B 27/034; G11B 27/038; G11B 27/105; H04L 29/08072; G06F 3/0481; G06F 3/0482; G06F 3/0486; G06F 3/04883; G06F 3/04886; G06F 3/0236;
(Continued)

(56) References Cited

U.S. PATENT DOCUMENTS 6,011,553 A * 1/2000 Komiyama ................... 715/839
8,060,525 B2 11/2011 Svendsen et al.
(Continued)

FOREIGN PATENT DOCUMENTS

WO WO 03/087980 A2 10/2003

OTHER PUBLICATIONS

"mLAN Graphic Patchbay Owner's Manual," published by Yamaha, 2004. 43 pages.*
(Continued)

*Primary Examiner* — Eric J Bycer
(74) *Attorney, Agent, or Firm* — Ditthavong & Steiner, P.C.

(57) ABSTRACT

An approach is provided for providing content lists using connecting user interface elements. The content-based patching platform causes, at least in part, a rendering of a user interface depicting at least one location-based content list and at least one other location-based content list. Next, the content-based patching platform determines one or more interactions with at least one connecting user interface element to cause, at least in part, an association of the at least one location-based content list with the at least one other location-based content list. Then, the content-based patching platform determines to create at least one mixed content list from the at least one location-based content list, the at least one other location-based content list, or a combination thereof based, at least in part, on the association.

20 Claims, 12 Drawing Sheets

(51) Int. Cl.

| | | |
|---|---|---|
| *G11B 20/10* | (2006.01) | |
| *G11B 27/028* | (2006.01) | |
| *G11B 27/034* | (2006.01) | |
| *G11B 27/038* | (2006.01) | |
| *G11B 27/10* | (2006.01) | |
| *G11B 27/34* | (2006.01) | |
| *G06F 3/0481* | (2013.01) | |
| *G06F 3/0482* | (2013.01) | |
| *G06F 3/0486* | (2013.01) | |
| *G06F 3/0488* | (2013.01) | |
| *G06F 3/023* | (2006.01) | |
| *G06F 17/50* | (2006.01) | |

(52) U.S. Cl.
CPC ...... *G06F 17/5045* (2013.01); *G06F 17/5068* (2013.01); *G06F 17/5081* (2013.01); *G11B 20/10527* (2013.01); *G11B 27/028* (2013.01); *G11B 27/038* (2013.01); *G11B 27/105* (2013.01); *G11B 27/34* (2013.01); *H04H 60/04* (2013.01); *H04L 29/08072* (2013.01)

(58) Field of Classification Search
CPC .............. G06F 3/0238; G06F 17/5068; G06F 17/5074; G06F 17/5081; G06F 17/5045
USPC ............. 381/119; 700/94; 716/118; 715/716, 715/748, 773, 810
See application file for complete search history.

(56) References Cited

U.S. PATENT DOCUMENTS

| | | | |
|---|---|---|---|
| 8,099,334 B1 | 1/2012 | Stockwell | |
| 8,496,532 B1* | 7/2013 | Bethke | A63F 13/822 463/42 |
| 2002/0188364 A1* | 12/2002 | Ota et al. | 700/94 |
| 2005/0182633 A1* | 8/2005 | Takemura et al. | 704/278 |
| 2006/0112335 A1 | 5/2006 | Hofmeister et al. | |
| 2007/0101291 A1* | 5/2007 | Forstall | G06F 3/0482 715/805 |
| 2008/0155440 A1* | 6/2008 | Trevor | G06Q 30/02 715/769 |
| 2008/0167129 A1* | 7/2008 | Aaron | A63F 13/10 463/42 |
| 2009/0017913 A1* | 1/2009 | Bell | A63F 13/46 463/40 |
| 2009/0049051 A1* | 2/2009 | Horowitz et al. | 707/10 |
| 2009/0049379 A1 | 2/2009 | Trevor et al. | |
| 2009/0083281 A1* | 3/2009 | Sarig et al. | 707/10 |
| 2009/0164429 A1 | 6/2009 | Svendsen et al. | |
| 2010/0037157 A1* | 2/2010 | Chang | G06F 8/36 715/764 |
| 2010/0115007 A1 | 5/2010 | Kobayashi | |
| 2010/0138742 A1 | 6/2010 | Holm et al. | |
| 2011/0055284 A1* | 3/2011 | Wallace et al. | 707/802 |
| 2011/0137920 A1* | 6/2011 | Cohen et al. | 707/748 |
| 2011/0283322 A1 | 11/2011 | Hamano | |
| 2012/0005577 A1* | 1/2012 | Chakra | G06F 3/0486 715/702 |
| 2012/0221687 A1* | 8/2012 | Hunter et al. | 709/219 |
| 2013/0039631 A1* | 2/2013 | Hovagim | H04N 5/765 386/200 |

OTHER PUBLICATIONS

Marti et al., "The Adaptive Song Selector or Locator (ASSOL)", dated Nov. 7, 1999, retrieved on Jul. 15, 2013, Retrieved from the internet: <URL: http://pubs.media.mit.edu/index2.jsp?selection=docdetail&id=209763&collection=Media+Lab&filtercollection=Media+Lab>, 7 pages.

Yahoo! Pipes, Wikipedia, dated Jan. 1, 2012, Retrieved Jul. 15, 2013, Retrieved from the internet: <URL http:web.archive.org/web/20120110025659/http://en.wikipedia.org/wiki/Yahoo!_Pipes>, 4 pages.

International Search Report for International Application No. PCT/JP2013/050299, date of mailing Jul. 19, 2013, 5 pages.

Written Opinion of the International Search Authority for International Application No. PCT/JP2013/050299, date of mailing Jul. 19, 2013, 9 pages.

AudioRealism, AudioRealism Bass Line Pro (ABL Pro), web page, Jan. 17, 2011, pp. 1-3, http://www.remixsoft.com/download/audiorealism-bass-line-pro-abl-pro.html.

Cellspotting.com, "A Global Location Based Information Service", web page, Aug. 28, 2012, pp. 1-3, http://www.cellspotting.com/webpages/cellspotting.html.

Urban Remix, "What is UrbanRemix?", web page, Aug. 28, 2012, 1 page, http://urbanremix.gatech.edu/.

* cited by examiner

METHOD AND APPARATUS FOR PROVIDING CONTENT LISTS USING CONNECTING USER INTERFACE ELEMENTS

BACKGROUND

Service providers and device manufacturers (e.g., wireless, cellular, etc.) are continually challenged to deliver value and convenience to consumers by, for example, providing compelling network services. One area of interest has been the development of services and technologies related to media playlists. For example, in recent years, services have offered users the ability to distribute and share their playlists, access media associated with shared playlists, etc. Nonetheless, developers must continue to differentiate their services and technologies to stay competitive. One approach is to develop new and/or easier ways of creating, modifying, and distributing playlists along with media items associated with those playlists.

SOME EXAMPLE EMBODIMENTS

Therefore, there is a need for an approach for providing content lists using connecting user interface elements.

According to one embodiment, a method comprises causing, at least in part, a rendering of a user interface depicting at least one location-based content list and at least one other location-based content list. The method also comprises determining one or more interactions with at least one connecting user interface element to cause, at least in part, an association of the at least one location-based content list with the at least one other location-based content list. The method further comprises determining to create at least one mixed content list from the at least one location-based content list, the at least one other location-based content list, or a combination thereof based, at least in part, on the association.

According to another embodiment, an apparatus comprises at least one processor, and at least one memory including computer program code for one or more computer programs, the at least one memory and the computer program code configured to, with the at least one processor, cause, at least in part, the apparatus to cause, at least in part, a rendering of a user interface depicting at least one location-based content list and at least one other location-based content list. The apparatus is also caused to determine one or more interactions with at least one connecting user interface element to cause, at least in part, an association of the at least one location-based content list with the at least one other location-based content list. The apparatus is further caused to determine to create at least one mixed content list from the at least one location-based content list, the at least one other location-based content list, or a combination thereof based, at least in part, on the association.

According to another embodiment, a computer-readable storage medium carries one or more sequences of one or more instructions which, when executed by one or more processors, cause, at least in part, an apparatus to cause, at least in part, a rendering of a user interface depicting at least one location-based content list and at least one other location-based content list. The apparatus is also caused to determine one or more interactions with at least one connecting user interface element to cause, at least in part, an association of the at least one location-based content list with the at least one other location-based content list. The apparatus is further caused to determine to create at least one mixed content list from the at least one location-based content list, the at least one other location-based content list, or a combination thereof based, at least in part, on the association.

According to another embodiment, an apparatus comprises means for causing, at least in part, a rendering of a user interface depicting at least one location-based content list and at least one other location-based content list. The apparatus also comprises means for determining one or more interactions with at least one connecting user interface element to cause, at least in part, an association of the at least one location-based content list with the at least one other location-based content list. The apparatus further comprises means for determining to create at least one mixed content list from the at least one location-based content list, the at least one other location-based content list, or a combination thereof based, at least in part, on the association.

In addition, for various example embodiments of the invention, the following is applicable: a method comprising facilitating a processing of and/or processing (1) data and/or (2) information and/or (3) at least one signal, the (1) data and/or (2) information and/or (3) at least one signal based, at least in part, on (or derived at least in part from) any one or any combination of methods (or processes) disclosed in this application as relevant to any embodiment of the invention.

For various example embodiments of the invention, the following is also applicable: a method comprising facilitating access to at least one interface configured to allow access to at least one service, the at least one service configured to perform any one or any combination of network or service provider methods (or processes) disclosed in this application.

For various example embodiments of the invention, the following is also applicable: a method comprising facilitating creating and/or facilitating modifying (1) at least one device user interface element and/or (2) at least one device user interface functionality, the (1) at least one device user interface element and/or (2) at least one device user interface functionality based, at least in part, on data and/or information resulting from one or any combination of methods or processes disclosed in this application as relevant to any embodiment of the invention, and/or at least one signal resulting from one or any combination of methods (or processes) disclosed in this application as relevant to any embodiment of the invention.

For various example embodiments of the invention, the following is also applicable: a method comprising creating and/or modifying (1) at least one device user interface element and/or (2) at least one device user interface functionality, the (1) at least one device user interface element and/or (2) at least one device user interface functionality based at least in part on data and/or information resulting from one or any combination of methods (or processes) disclosed in this application as relevant to any embodiment of the invention, and/or at least one signal resulting from one or any combination of methods (or processes) disclosed in this application as relevant to any embodiment of the invention.

In various example embodiments, the methods (or processes) can be accomplished on the service provider side or on the mobile device side or in any shared way between service provider and mobile device with actions being performed on both sides.

For various example embodiments, the following is applicable: An apparatus comprising means for performing the method of any of originally filed claims.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings.

DESCRIPTION OF SOME EMBODIMENTS

Examples of a method, apparatus, and computer program for providing content lists using connecting user interface elements are disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
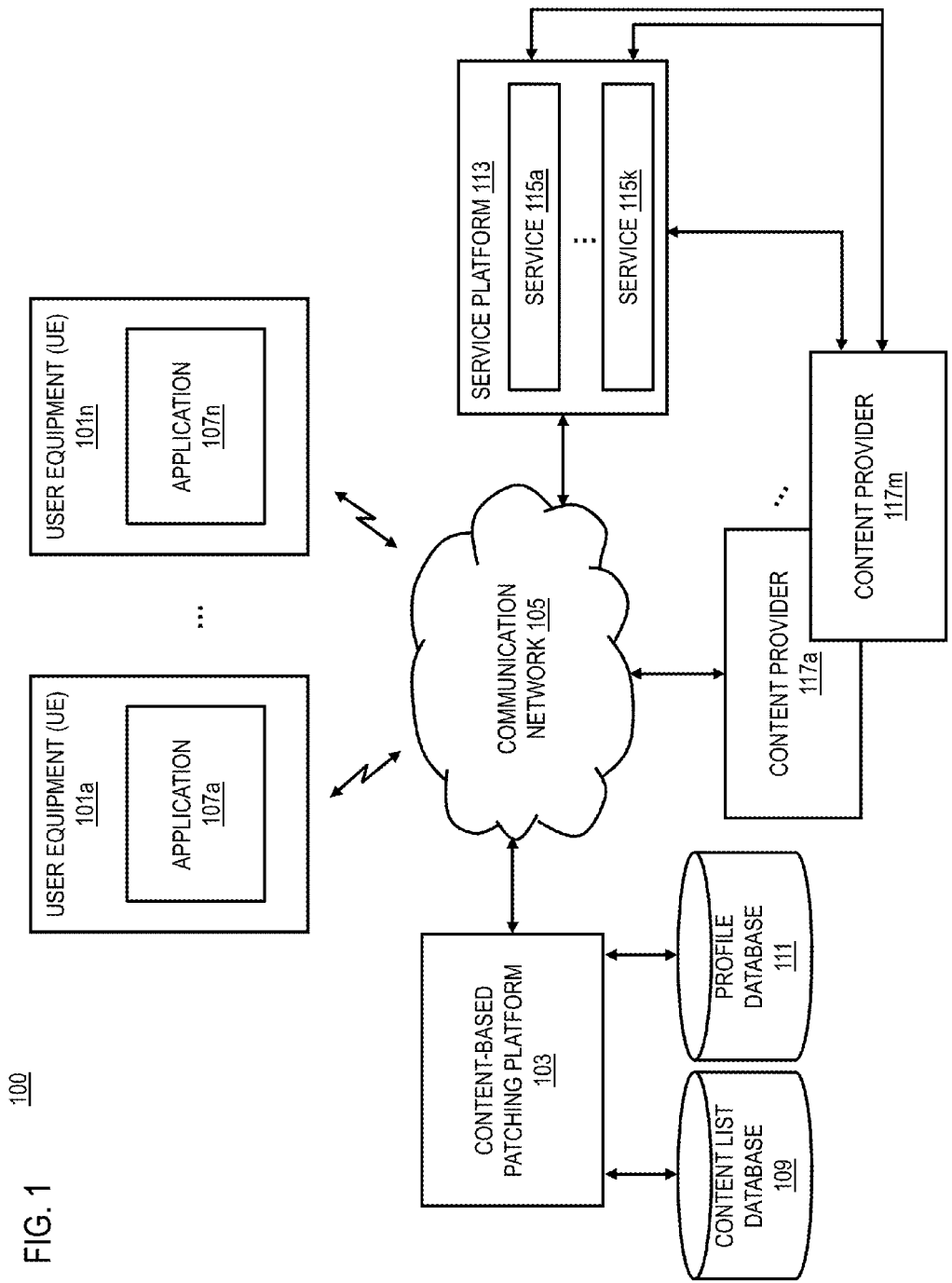
FIG. 1 is a diagram of a system capable of providing content lists using connecting user interface elements, according to one embodiment.

FIG. 1 is a diagram of a system capable of providing content lists using connecting user interface elements, according to one embodiment. As discussed, although there has been significant development of services and technologies related to creation, modification, and distribution of media playlists, developers must nevertheless continue to differentiate their services and technologies to stay competitive. For example, developers may need to continue to provide new and/or easier ways of creating, modifying, and distributing playlists along with media items associated with those playlists.

To address this problem, a system 100 of FIG. 1 introduces the capability to provide content lists using connecting user interface elements. It is noted that although various embodiments are described with respect to media playlists, it is contemplated that the approach described herein may be used with other content lists. By way of example, the system 100 may render a user interface depicting a location-based content list and another location-based content list. The system 100 may also determine interactions with a connecting user interface element (e.g., associated with the user interface) to cause an association of the location-based content list with the other location-based content list. The system 100 may then create a mixed content list from the location-based content list and/or the other location-based content list based on the association. In one scenario, a user may be provided with a user interface featuring a map along with representations of playlists associated with various territories or regions on the map. The user may, for instance, utilize a connecting user interface element to patch songs from playlists represented on the map (and, thus, from the various territories). As an example, the connecting user interface element may be a virtual patch cable for creating playlists that includes content from various territories. When the user is patching songs from the different territories, a server may create a vector of song identifiers (IDs), and create a mixed playlist containing links (e.g., uniform resource identifiers (URIs)) of the song files located in an associated service database. In this way, users are provided with interesting playlists with varying genres that dominate the various territories. In addition, the connecting user interface element (e.g., virtual patch cables) facilitates simple and effective creation of cross-stylistic playlists (e.g., by connecting a Bronx region to a Dublin region).

As shown in FIG. 1, the system 100 comprises a user equipment (UE) 101 (or multiple UEs 101a-101n) having connectivity to a content-based patching platform 103 via a communication network 105. The UE 101 may include or have access to an application 107 (e.g., applications 107a-107n) to enable the UE 101 to interact with, for instance, the content-based patching platform 103, which may: (1) cause a rendering of a user interface depicting a location-based content list and another location-based content list; (2) cause an association of the location-based content list and the other location-based content list based on one or more interactions with a connecting user interface element; (3) create a mixed content list from the location-based content list and/or the other location-based content list based on the association; (4) cause a modification to the location-based list and/or the other location-based list in response to consumption of content items in proximity to a point of interest associated with the location-based content list and/or another point of interest associated with the other location-based content list; (5) determine conquest of the point of interest and/or the other point of interest based on the consumption; (6) cause an addition of a content item associated with the conquest to the location-based content list and/or the other location-based content list; (7) cause an action with respect to the mixed content list based on other interactions among another connecting user interface element and a user interface module; or (8) perform other functions.

In various embodiments, the content-based patching platform 103 may include or have access to a content list database 109 to access or store content lists, content data associated with the content lists (e.g., content files, metadata, etc.), etc. The content-based patching platform 103 may also include or have access to a profile database 111 to access or store account information, consumption data (e.g., content items consumed, locations associated with the consumption, etc.), profiles for points of interests (e.g., location information, content lists associated with the points of interest, etc.), etc. Data stored in the content list database 109 and the profile database 111 may, for instance, be provided by the UEs 101, a service platform 113, one or more services 115 (or services 115a-115k), one or more content providers 117 (or content providers 117a-117m), and/or other services available over the communication network 105. For example, a certain service 115 may provide content items, links to content items, etc., along with an initial set of content lists and profiles for points of interests. Moreover, the content-based patching platform 103 may provide consumption data collected from UEs 101 and augment the initial set of content lists and the profiles based on the consumption data. It is noted that the content-based patching platform 103 may be a separate entity of the system 100, a part of the one or more services 115 of the service platform 113, or included within the UE 101 (e.g., as part of the application 107).

By way of example, the communication network 105 of system 100 includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (WiFi), wireless LAN (WLAN), Bluetooth®, Internet Protocol (IP) data casting, satellite, mobile ad-hoc network (MANET), and the like, or any combination thereof.

The UE 101 is any type of mobile terminal, fixed terminal, or portable terminal including a mobile handset, station, unit, device, multimedia computer, multimedia tablet, Internet node, communicator, desktop computer, laptop computer, notebook computer, netbook computer, tablet computer, personal communication system (PCS) device, personal navigation device, personal digital assistants (PDAs), audio/video player, digital camera/camcorder, positioning device, television receiver, radio broadcast receiver, electronic book device, game device, or any combination thereof, including the accessories and peripherals of these devices, or any combination thereof. It is also contemplated that the UE 101 can support any type of interface to the user (such as "wearable" circuitry, etc.).

In another embodiment, the content-based patching platform 103 may determine at least one point of interest associated with the at least one location-based content list and at least one other point of interest associated with the at least one other location-based content list. Moreover, the content-based patching platform 103 may determine one or more consumptions of one or more content items in proximity to the at least one point of interest, the at least one other point of interest, or a combination thereof. Furthermore, the content-based patching platform 103 may cause, at least in part, a modification to the at least one location-based content list, the at least one other location-based content list, or a combination thereof based, at least in part, on the one or more consumptions.

By way of example, each point of interest (e.g., territory, area, region, place, etc.) may be associated with a playlist. As a user listens to songs on her user device (e.g., UE 101), the user device may transmit consumption data to the content-based patching platform 103. The consumption data may, for instance, include the songs consumed, the user's location and route during playback of each of the songs, etc. The content-based patching platform 103 may then utilize the consumption data to determine the points of interest that the user was near when listening to each of the various songs, and modify the associated playlists based on such determination. In one use case, if a particular point of interest has not yet been determined to have been "conquered" (e.g., by a user, a group of users, a genre, a media item, etc.), the content-based patching platform 103 may add songs to the top of a playlist based on a determination that at least a certain number of users have listened to those songs near the point of interest associated with the playlist. In a further scenario, each location-based playlist (or the associated point of interest) may be depicted on a user interface with a patchbay that enables the location-based playlist to be connected/patched with virtual patch cables. Each patchbay may, for instance, include at least one input socket and one output socket. The input and output sockets may also have several instances to enable multiple users to connect the same songs to their playlists. Moreover, the patchbays may have other insert points (e.g., dedicated sockets for locating the chorus or verse, output sockets that output the entire playlist of a territory, etc.)

In another embodiment, the content-based patching platform 103 may determine conquest of the at least one point of interest, the at least one other point of interest, or a combination thereof based, at least in part, on the one or more consumptions. In addition, the content-based patching platform 103 may determine at least one of the one or more content items associated with the conquest to cause, at least in part, an addition of the at least one content item to the at least one location-based content list, the at least one other location-based content list, or a combination thereof. In one scenario, users may conquer a particular area by moving around the area while listening to music. For example, a group of users may be determined to have conquered an area if the group of users have moved around that area while listening to music more frequently than any other user groups. In addition, an area may be conquered (or reconquered) by another user group if, for instance, the other user group moves around the area while listening to music more frequently than the current conqueror group. It is noted that, in some embodiments, conquest of territories, areas, places, etc., based on consumption in proximity to the various points of interest may be implemented in a game, an activity, etc.

In a further scenario, each territory may include a stack of songs, where the topmost song indicates the current owner of the territory and the other songs below the topmost song indicate the previous owners of the territory. As an example, when a territory is conquered by a user group, a song associated with the user group may be added to top of the song stack to indicate the new owner of the territory. In yet another scenario, each of the territory stacks may be depicted on a user interface and may feature a virtual patchbay (e.g., with input and output sockets) that can be used to connect different songs from various territories in a chain to create a mixed playlist. As such, users may create new and interesting cross-stylistic playlists featuring the dominating music from the different territories.

In another embodiment, the content-based patching platform 103 may cause, at least in part, a rendering of at least one map that includes one or more indicators representing the one or more consumptions. In a further embodiment, one or more characteristics of the one or more indicators may be based, at least in part, on respective consumption amounts of the one or more content items for the at least one point of interest, the at least one other point of interest, or a combination thereof. By way of example, the more music that is being listened through a territory, the brighter that territory may glow on the map. In addition, the map may include various color indicators (or other indicators) to illustrate the music genres being played (e.g., based on the dominating music genre in the particular territory), the songs being played, etc. In this way, real-time indications with respect to popularity of music, genres, songs, etc., from a map perspective may be provided. As noted, these real-time indications may also be offered for other types of media along with other types of content.

In another embodiment, the content-based patching platform 103 may cause, at least in part, a rendering of one or more user interface modules. The content-based patching platform 103 may then determine one or more other interactions among at least one other connecting user interface element and the one or more user interface modules to cause, at least in part, one or more actions with respect to the at least one mixed content list. In one use case, for instance, the other connecting user interface element may be depicted as a virtual patch cable for patching the mixed content list to the various user interface modules. It is noted that, in certain embodiments, third party developers would be able to implement plug-ins which allow adding new module types which may, for instance, publish song listening data to new social network services, perform new modifications for the content, etc.

In another embodiment, the content-based patching platform 103 may cause, at least in part, a transfer of the at least one mixed content list, one or more media files associated with the at least one mixed content list, content information associated with the at least one mixed content list, or a combination thereof to one or more devices, one or more services, or a combination thereof in response to the one or more other interactions, wherein the one or more actions include the transfer. In one scenario, Brian may glance at a map on his mobile device and see that heavy metal music appears to be dominating the west side of his hometown. Brian may zoom closer to activate playback of the dominating songs from the different territories. Brian may thereafter decide to create a new playlist from the various dominating songs. As such, Brian may connect the different territories on the map using virtual patch cables, which causes the new playlist to be created. To share the new playlist to Jennifer, Brian may connect the output socket associated with the new playlist to the input socket of a sharing module rendered on the mobile device using another virtual patch cable. Brian may then connect the output socket of the sharing module to an input socket associated with Jennifer. As a result, Jennifer may now listen to the new playlist that Brian created, for instance, through her own mobile device. In another scenario, Brian may connect the new playlist to a sharing module using a virtual patch cable, and the sharing module to a social networking service module using another virtual patch cable. Consequently, a link to the new playlist may be shared to Brian's friends in his social networking group, and Brian's friends may listen to the playlist by clicking on the link.

In another embodiment, the content-based patching platform 103 may cause, at least in part, a modification to the at least one mixed content list, one or more media files associated with the at least one mixed content list, content information associated with the at least one mixed content list, or a combination thereof in response to the one or more other interactions, wherein the one or more actions include the modification. By way of example, a synchronization module may be rendered on the user interface. Frank, who is listening to a playlist mixed from various location-based playlists, may want to force beat matching for his mixed playlist. Thus, Frank may connect the synchronization module to an input socket of the mixed playlist. In some cases, all users who are listening to Frank's mixed playlist will be affected by Frank's act of connecting the synchronization module to the mixed playlist. If, for instance, each client device implements its own synchronization module (e.g., beat matching module), the content-based patching platform 103 may signal the client devices that Frank's mixed playlist was connected to a synchronization module. As such, each client device may perform beat matching to adjacent songs in the mixed playlist before rendering them to the users. The beat matching may be performed in a number of ways, including beat and downbeat analysis to obtain beats/downbeats of the songs, and then applying time stretching to match the song tempi during a transition period, and time-aligning the signals so that their beats and downbeats match during the transition period.

In another embodiment, the content-based patching platform 103 may cause, at least in part, a rendering of one or more input connection components, one or more output connection components, or a combination thereof for interacting with the at least one connecting user interface element, the at least one other connecting user interface element, the at least one location-based content list, the at least one other location-based content list, the at least one mixed content list, the one or more user interface modules, or a combination thereof. In a further embodiment, the one or more interactions, the one or more other interactions, or a combination thereof may include, at least in part, a connecting of at least one of the one or more input connection components to at least one of the one or more output connection components using the at least one connecting user interface element, the at least one other connecting user interface element, or a combination thereof. In one scenario, for instance, each content list and modules depicted on the user interface may include one or more input/output sockets to enable patching with the various patch cables.

By way of example, the UE 101, the content-based patching platform 103, the service platform 113, the services 115, and the content providers 117 communicate with each other and other components of the communication network 105 using well known, new or still developing protocols. In this context, a protocol includes a set of rules defining how the network nodes within the communication network 105 interact with each other based on information sent over the communication links. The protocols are effective at different layers of operation within each node, from generating and receiving physical signals of various types, to selecting a link for transferring those signals, to the format of information indicated by those signals, to identifying which software application executing on a computer system sends or receives the information. The conceptually different layers of protocols for exchanging information over a network are described in the Open Systems Interconnection (OSI) Reference Model.

Communications between the network nodes are typically effected by exchanging discrete packets of data. Each packet typically comprises (1) header information associated with a particular protocol, and (2) payload information that follows the header information and contains information that may be processed independently of that particular protocol. In some protocols, the packet includes (3) trailer information following the payload and indicating the end of the payload information. The header includes information such as the source of the packet, its destination, the length of the payload, and other properties used by the protocol. Often, the data in the payload for the particular protocol includes a header and payload for a different protocol associated with a different, higher layer of the OSI Reference Model. The header for a particular protocol typically indicates a type for the next protocol contained in its payload. The higher layer protocol is said to be encapsulated in the lower layer protocol. The headers included in a packet traversing multiple heterogeneous networks, such as the Internet, typically include a physical (layer 1) header, a data-link (layer 2) header, an internetwork (layer 3) header and a transport (layer 4) header, and various application (layer 5, layer 6 and layer 7) headers as defined by the OSI Reference Model.

Figure 2:
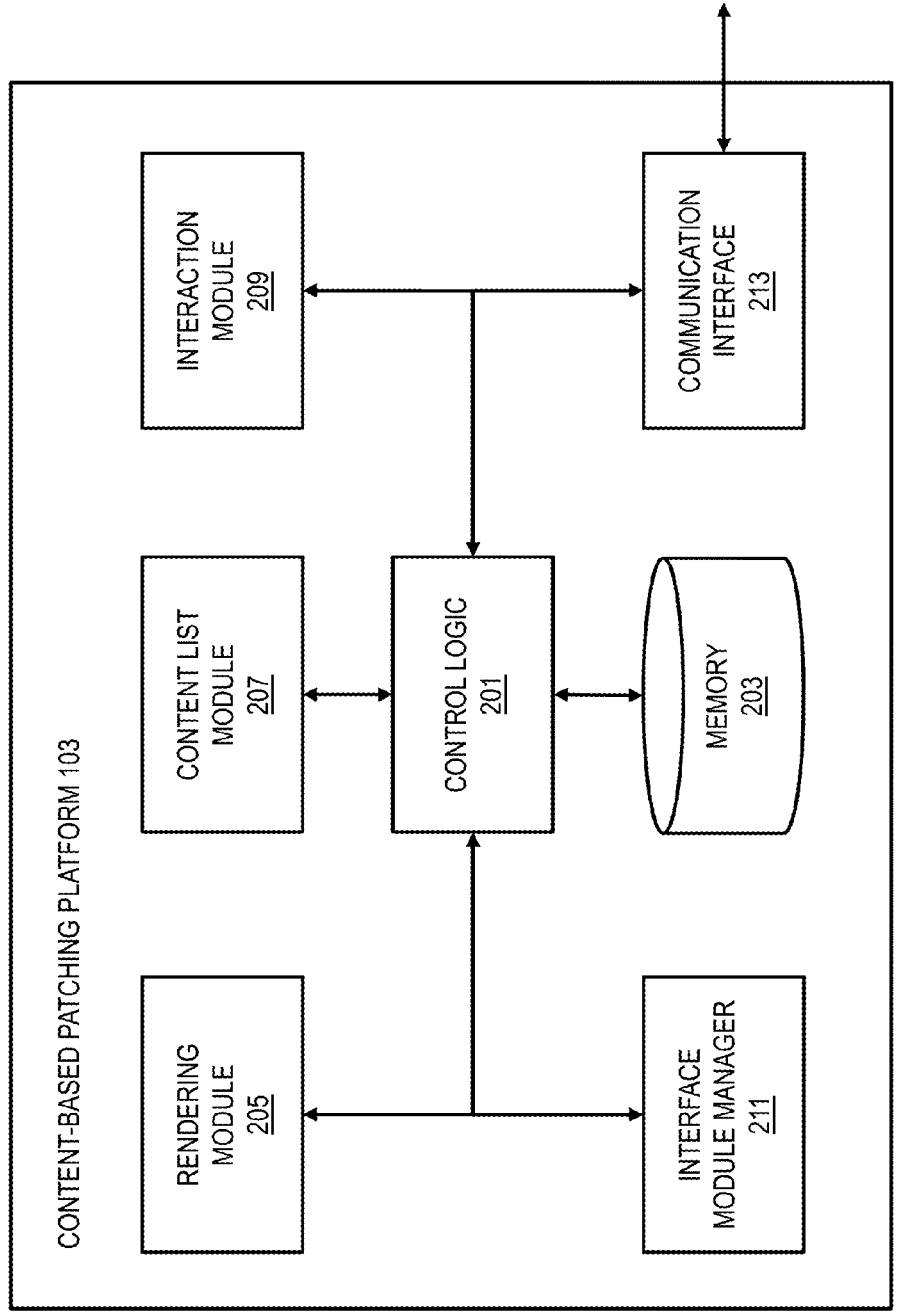
FIG. 2 is a diagram of the components of a content-based patching platform, according to one embodiment.

FIG. 2 is a diagram of the components of a content-based patching platform, according to one embodiment. By way of example, the content-based patching platform 103 includes one or more components for providing content lists using connecting user interface elements. It is contemplated that the functions of these components may be combined in one or more components or performed by other components of equivalent functionality. In this embodiment, the content-based patching platform 103 includes control logic 201, memory 203, a rendering module 205, a content list module 207, an interaction module 209, an interface module manager 211, and a communication interface 213.

The control logic 201 executes at least one algorithm for executing functions of the content-based patching platform 103. For example, the control logic 201 may interact with the rendering module 205 to render a user interface depicting a location-based content list and another location-based content list. In certain embodiments, a particular location-based content list may be based on consumption of content items near a points of interest (e.g., territory, area, region, place, etc.) associated with that location-based content list. The control logic 201 may, for instance, direct the content list module 207 to determine a point of interest associated with the location-based content list and another point of interest associated with the other location-based content list. The content list module 207 may also determine one or more consumptions of content items within a particular proximity (e.g., a proximity threshold) of the point of interest and/or the other point of interest, and then modify the location-based content list and/or the other location-based content list in response to the determined consumptions (e.g., modifications to the content lists, content items associated with the content lists, content information associated with the content list, etc.).

In some embodiments, a location-based content list may be based on conquest of a point of interest associated with that location-based content list. The content list module 207 may, for instance, add a content item to the location-based content list if it is determined that the content item is associated with the conquest. As indicated, in one scenario, users may conquer a particular area by moving around the area while listening to music. As such, music associated with the conqueror may be added to the top of the location-based content list associated with the area to indicate the ownership of the area by the conqueror. In another scenario, conquest may be determined by the most frequently played song within a particular duration of time (e.g., within the last hour, within the last day, etc.). Thus, a song may be determined to have conquered an area if the song is determined to be the most frequently played song by users walking around in that area. As a result, the song may be added to the top of the location-based content list associated with the area to indicate that the song is the current conqueror of the area.

Moreover, the control logic 201 may work with the interaction module 209 to determine one or more interactions with a connecting user interface element to cause an association of the location-based content list and the other location-based content list. The control logic 201 may then signal the content list module 207 to create a mixed content list from the location-based content list and/or the other location-based content list based on the association. In various embodiments, the control logic 201 may also employ the interface module manager 211 to facilitate one or more user interface modules (e.g., sharing module, synchronization module, filter module, etc.) on the user interface. For illustrative purposes, the user interface modules may include, but are not limited to, the following examples in Table 1 below:

TABLE 1

| | |
|---|---|
| Synchronization Module: | Provides beat matching for songs played via connected playlists. |
| Sharing Module: | Enables chains of songs patched together from various playlists combinations to be connected to friends to share the playlists constructed from these song chains (e.g., via direct transfer to the friend's mobile device, through blogs, on social network services, etc.). |
| Sourcing Module: | Enables automatic input of previously unknown music to connected playlists. |
| Artist Watch Module: | Provides dynamic update of new content from selected artists when the content becomes available. |
| Counter Module: | Counts the traffic going through the territory for statistical purposes. |
| Media Converter Module: | Enables conversion of playlists to be used with various devices, applications, etc. |

The control logic 201 may additionally utilize the communication interface 213 to communicate with other components of the content-based patching platform 103, the UEs 101, the service platform 113, the services 115, the content providers 117, and other components of the system 100. For example, the communication interface 213 may be utilized to receive consumption data from the UEs 101, the services 115, etc. The communication interface 213 may further include multiple means of communication. In one use case, the communication interface 213 may be able to communicate over short message service (SMS), multimedia messaging service (MMS), internet protocol, email, instant messaging, voice sessions (e.g., via a phone network), or other types of communication.

Figure 3:
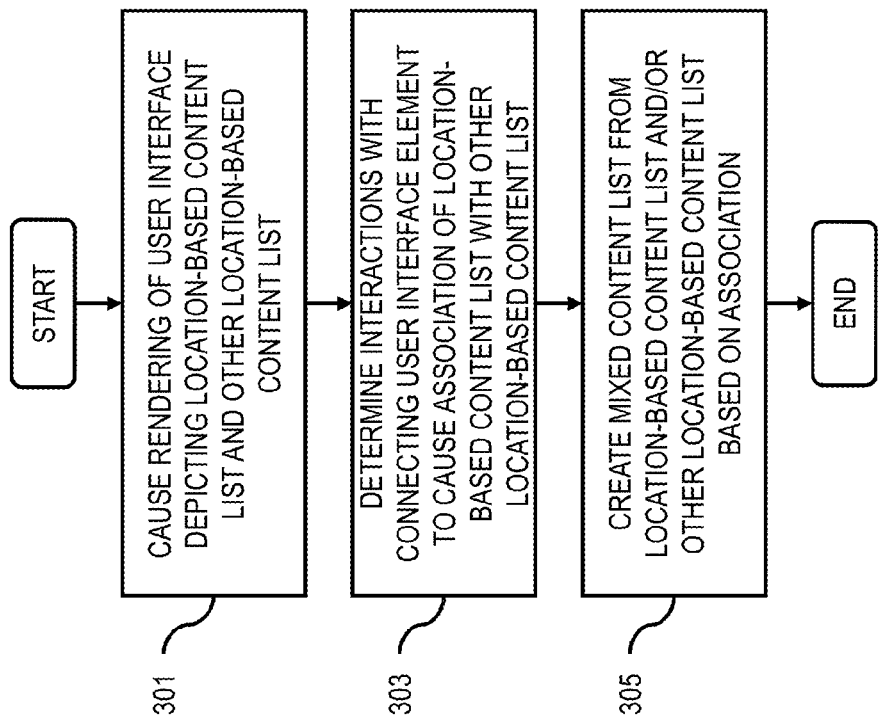
FIG. 3 is a flowchart of a process for providing content lists using connecting user interface elements, according to one embodiment.
Figure 11:
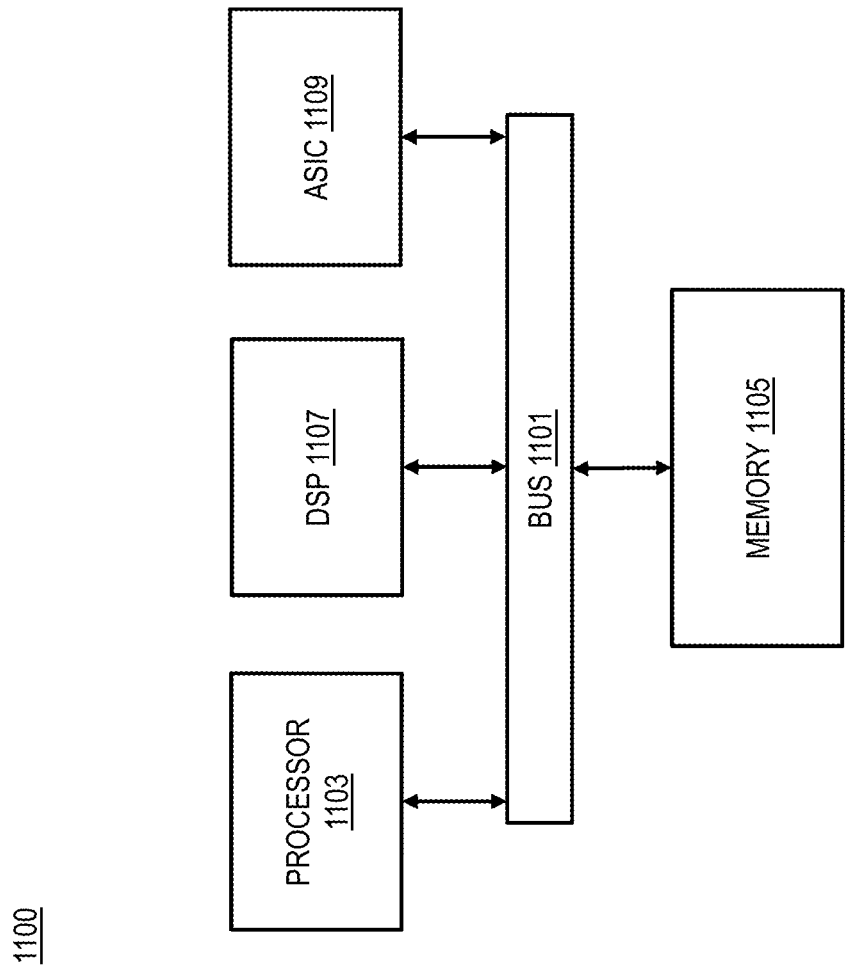
FIG. 11 is a diagram of a chip set that can be used to implement an embodiment of the invention.

FIG. 3 is a flowchart of a process for providing content lists using connecting user interface elements, according to one embodiment. In one embodiment, the content-based patching platform 103 performs the process 300 and is implemented in, for instance, a chip set including a processor and a memory as shown in FIG. 11. As such, the control logic 201 can provide means for accomplishing various parts of the process 300 as well as means for accomplishing other processes in conjunction with other components of the content-based patching platform 103. In step 301, the control logic 201 may cause, at least in part, a rendering of a user interface depicting at least one location-based content list and at least one other location-based content list (e.g., a map user interface may depict representations of the location-based content lists).

In step 303, the control logic 201 may also determine one or more interactions with at least one connecting user interface element to cause, at least in part, an association of the at least one location-based content list with the at least one other location-based content list. The control logic 201 may then, at step 305, determine to create at least one mixed content list from the at least one location-based content list, the at least one other location-based content list, or a combination thereof based, at least in part, on the association. By way of example, one or more playlists corresponding to various territories may be represented on a map user interface, which may also provide the user with one or more virtual patch cables for patching together songs of the various playlists. The virtual patch cables may, for instance, be utilized to create a chain of songs from each of the playlists selected by the user. Thus, the chain (e.g., made up of songs and patch cables) may be utilized to cause the association of the selected playlists along with the creation of a new playlist mixed from the selected location-based playlists.

Figure 4:
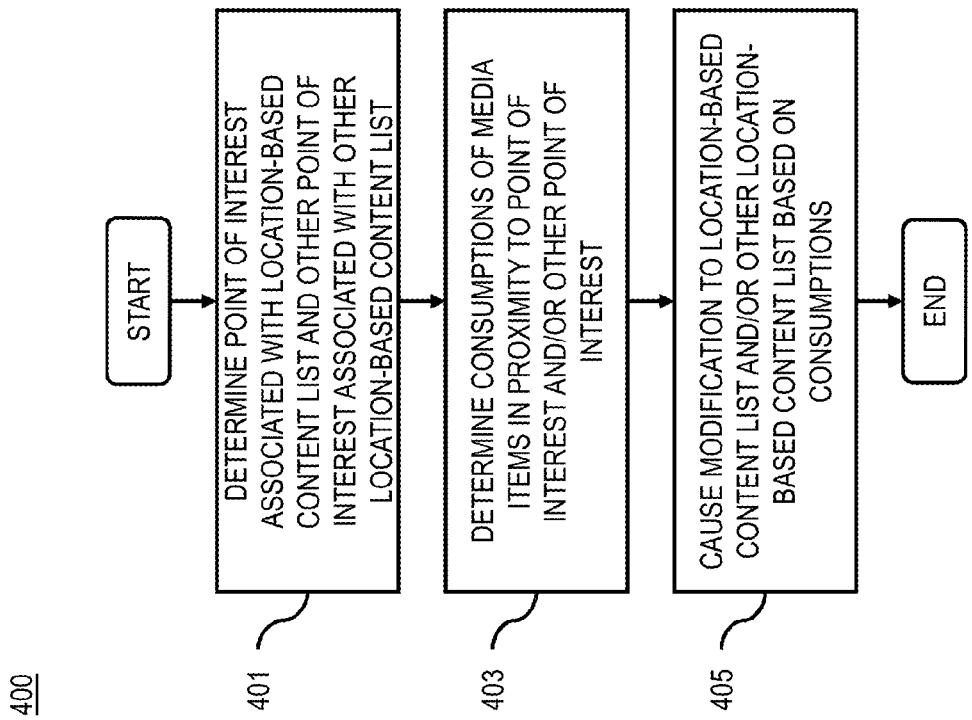
FIG. 4 is a flowchart of a process for modifying content lists according to location-based consumptions, according to one embodiment.

FIG. 4 is a flowchart of a process for modifying content lists according to location-based consumptions, according to one embodiment. In one embodiment, the content-based patching platform 103 performs the process 400 and is implemented in, for instance, a chip set including a processor and a memory as shown in FIG. 11. As such, the control logic 201 can provide means for accomplishing various parts of the process 400 as well as means for accomplishing other processes in conjunction with other components of the content-based patching platform 103.

In step 401, the control logic 201 may determine at least one point of interest associated with the at least one location-based content list and at least one other point of interest associated with the at least one other location-based content list. As indicated, points of interest may include territories, areas, places, etc., that may be of interest to users. In one scenario, for instance, a particular media playlist may be made up of songs and videos that are frequently played in a certain area of a city (e.g., the east side of Bronx). As such, the area may be determined to be associated with the media playlist.

In step 403, the control logic 201 may determine one or more consumptions of one or more content items in proximity to the at least one point of interest, the at least one other point of interest, or a combination thereof. The control logic 201 may then, at step 405, cause, at least in part, a modification to the at least one location-based content list, the at least one other location-based content list, or a combination thereof based, at least in part, on the one or more consumptions. As an example, if it is determined that certain songs are frequently played in a particular area, those songs may be added to the media playlist associated with that area.

Figure 5:
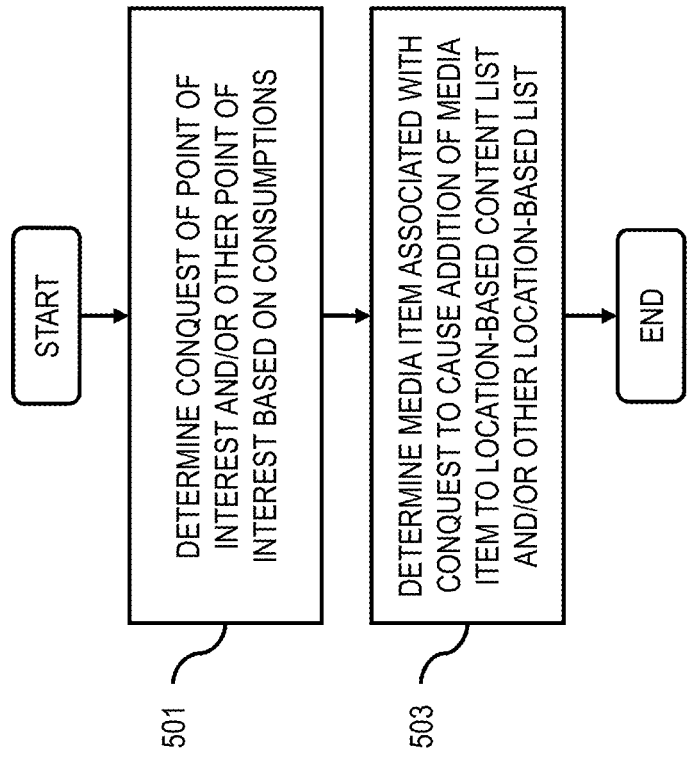
FIG. 5 is a flowchart of a process for modifying content list according to points of interest conquests, according to one embodiment.

FIG. 5 is a flowchart of a process for modifying content list according to points of interest conquests, according to one embodiment. In one embodiment, the content-based patching platform 103 performs the process 500 and is implemented in, for instance, a chip set including a processor and a memory as shown in FIG. 11. As such, the control logic 201 can provide means for accomplishing various parts of the process 500 as well as means for accomplishing other processes in conjunction with other components of the content-based patching platform 103.

In step 501, the control logic 201 may determine conquest of the at least one point of interest, the at least one other point of interest, or a combination thereof based, at least in part, on the one or more consumptions. In one use case, players of an interactive role-playing game may earn items, credits, etc., by conquering territories in the game that correspond to areas in a particular city, town, state, or country. Players may, for instance, conquer territories by moving around in the corresponding real areas while listening to music more frequently than players who currently own those territories.

In step 503, the control logic 201 may determine at least one of the one or more content items associated with the conquest to cause, at least in part, an addition of the at least one content item to the at least one location-based content list, the at least one other location-based content list, or a combination thereof. Upon conquering a territory in the role-playing game, for instance, a song associated with the conquering player may be added to the media playlist corresponding to the territory. As an example, the song may be one of the songs that the conquering player listened to while moving around in the corresponding real area.

Figure 6:
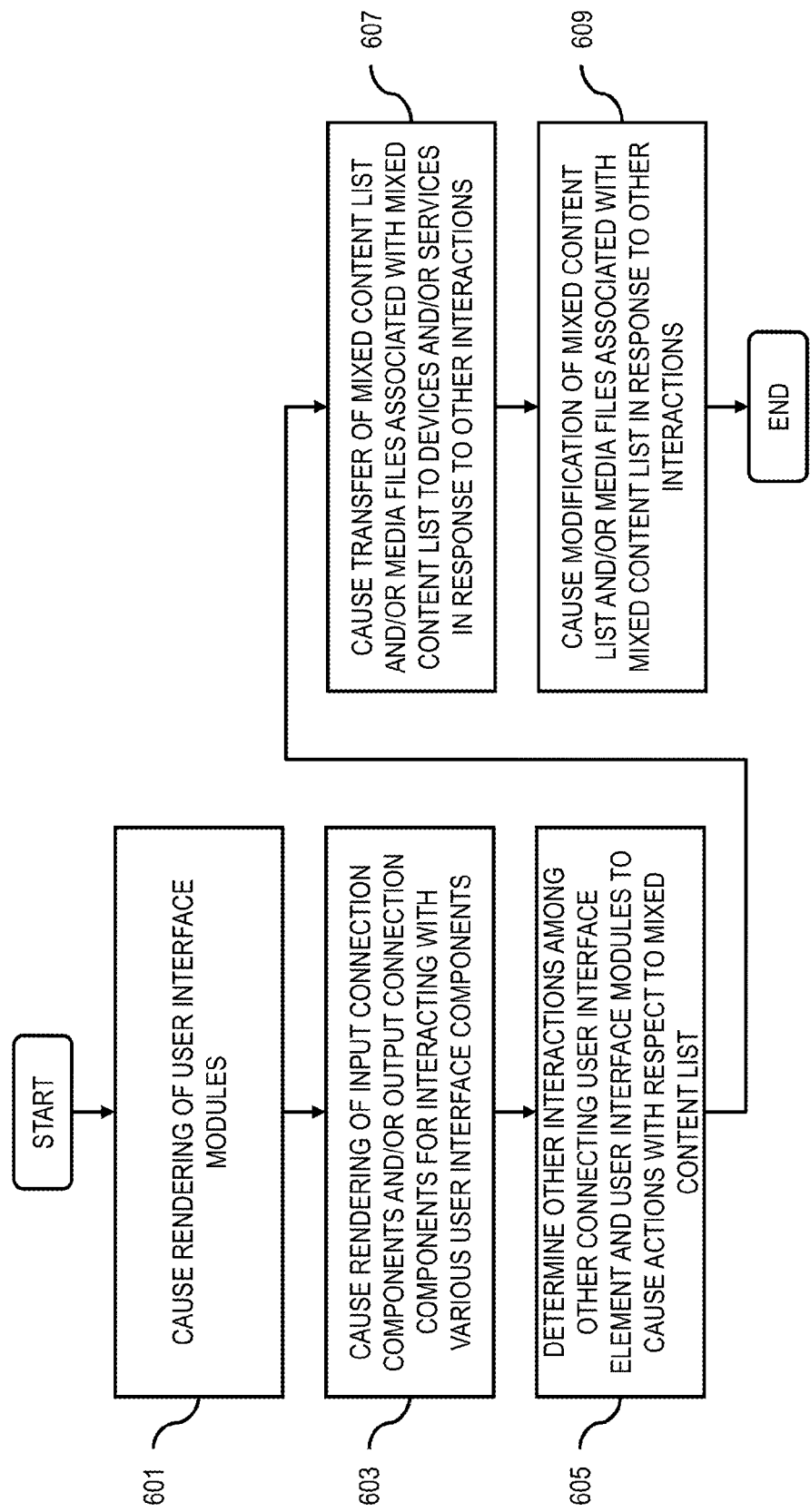
FIG. 6 is a flowchart of a process for causing actions with respect to a mixed content list based on interactions among connecting user interface elements and user interface modules, according to one embodiment.

FIG. 6 is a flowchart of a process for causing actions with respect to a mixed content list based on interactions among connecting user interface elements and user interface modules, according to one embodiment. In one embodiment, the content-based patching platform 103 performs the process 600 and is implemented in, for instance, a chip set including a processor and a memory as shown in FIG. 11. As such, the control logic 201 can provide means for accomplishing various parts of the process 600 as well as means for accomplishing other processes in conjunction with other components of the content-based patching platform 103.

In step 601, the control logic 201 may cause, at least in part, a rendering of one or more user interface modules. Moreover, in step 603, the control logic 201 may cause, at least in part, a rendering of one or more input connection components, one or more output connection components, or a combination thereof for interacting with various user interface components. The user interface components may, for instance, include the at least one connecting user interface element, at least one other connecting user interface element, the at least one location-based content list, the at least one other location-based content list, the at least one mixed content list, the one or more user interface modules, or a combination thereof.

In step 605, the control logic 201 may determine one or more other interactions among the at least one other connecting user interface element and the one or more user interface modules to cause, at least in part, one or more actions with respect to the at least one mixed content list. As discussed, in some embodiments, the one or more interactions, the one or more other interactions, or a combination thereof may include, at least in part, a connecting of at least one of the one or more input connection components to at least one of the one or more output connection components using the at least one connecting user interface element, the at least one other connecting user interface element, or a combination thereof.

In certain embodiments, the one or more actions may include a transfer of the at least one mixed content list, one or more media files associated with the at least one mixed content list, content information associated with the at least one mixed content list, or a combination thereof. As such, in step 607, the control logic 201 may cause, at least in part, a transfer of the at least one mixed content list, the one or more media files associated with the at least one mixed content list, the content information associated with the at least one mixed content list, or a combination thereof to one or more devices, one or more services, or a combination thereof in response to the one or more other interactions.

In various embodiments, the one or more actions may include a modification to the at least one mixed content list, one or more media files associated with the at least one mixed content list, content information associated with the at least one mixed content list, or a combination thereof. Thus, in step 609, the control logic 201 may cause, at least in part, a modification to the at least one mixed content list, the one or more media files associated with the at least one mixed content list, the content information associated with the at least one mixed content list, or a combination thereof in response to the one or more interactions.

Figure 7:
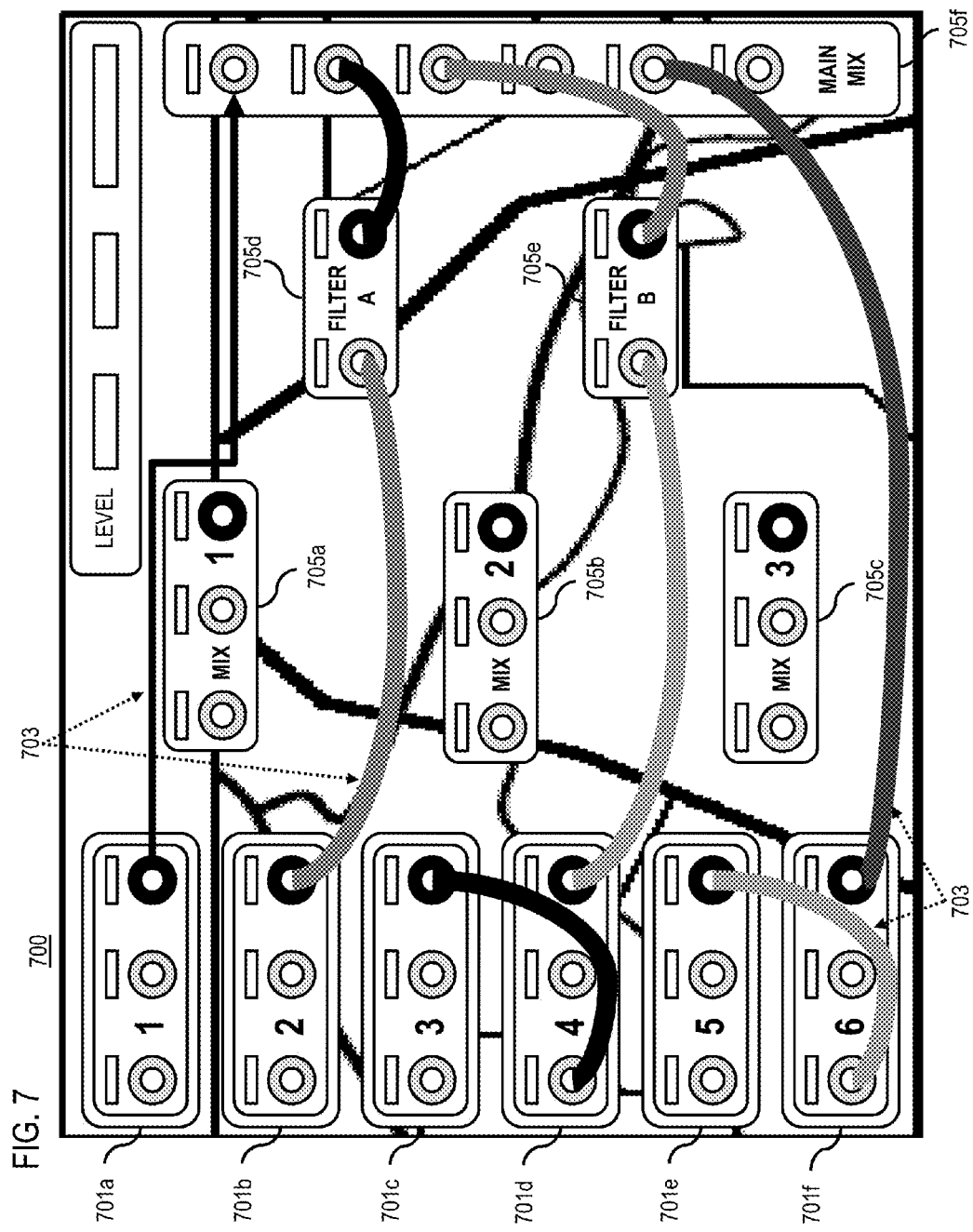
FIG. 7 is a diagram of a user interface for providing content lists using connecting user interface elements, according to one embodiment.

FIG. 7 is a diagram of a user interface for providing content lists using connecting user interface elements, according to one embodiment. As shown, the user interface 700 features patchbays 701a-701f (e.g., one for each of the territories 1-6) along with virtual patch cables 703 for connecting the patchbays 701a-701f to each other and to one or more user interface modules 705a-705f. The patchbays 701a-701f may, for instance, represent the playlists associated the territories. By way of example, the patchbays 701a-701f and the various user interface modules 705a-705f may include at least one input socket and/or at least one output socket which the user may use with virtual patch cables 703 to form connections.

As illustrated, the patchbay 701a is directly connected to the user interface module 705f using a virtual patch cable 703, which may feed songs from the playlist associated with patchbay 701a (e.g., corresponding to territory 1) to a main mixed playlist created by the user interface module 705f. In addition, the patchbay 701b is connected to the user interface module 705f through two virtual patch cables and the user interface module 705d (e.g., filter module). In one scenario, for instance, the user interface module 705d may only pull songs from the playlist associated with the patchbay 701b that the user has not recently listened to.

As indicated, in some embodiments, each territory may have a stack of songs where the topmost song indicates the current owner of the territory and the other songs indicate the previous owners of the territory. In further embodiments, connecting of those playlists with each other may form a chain including the topmost song from each of the playlists. Thus, a mixed playlist generated from such a chain may, for instance, represent the dominating songs of those territories.

In various embodiments, users may have a profile page with patchbays (e.g., patchbays 701a-701f) to connect favorite playlists and remixes. Remixes and mash-ups of different songs may be performed by connecting different user interface modules between songs (e.g., the patchbays may have connection sockets for each of the songs of the associated playlist), or using special insert points (e.g., chorus only, verse only, etc.) in the patch cable routing.

Figure 8:
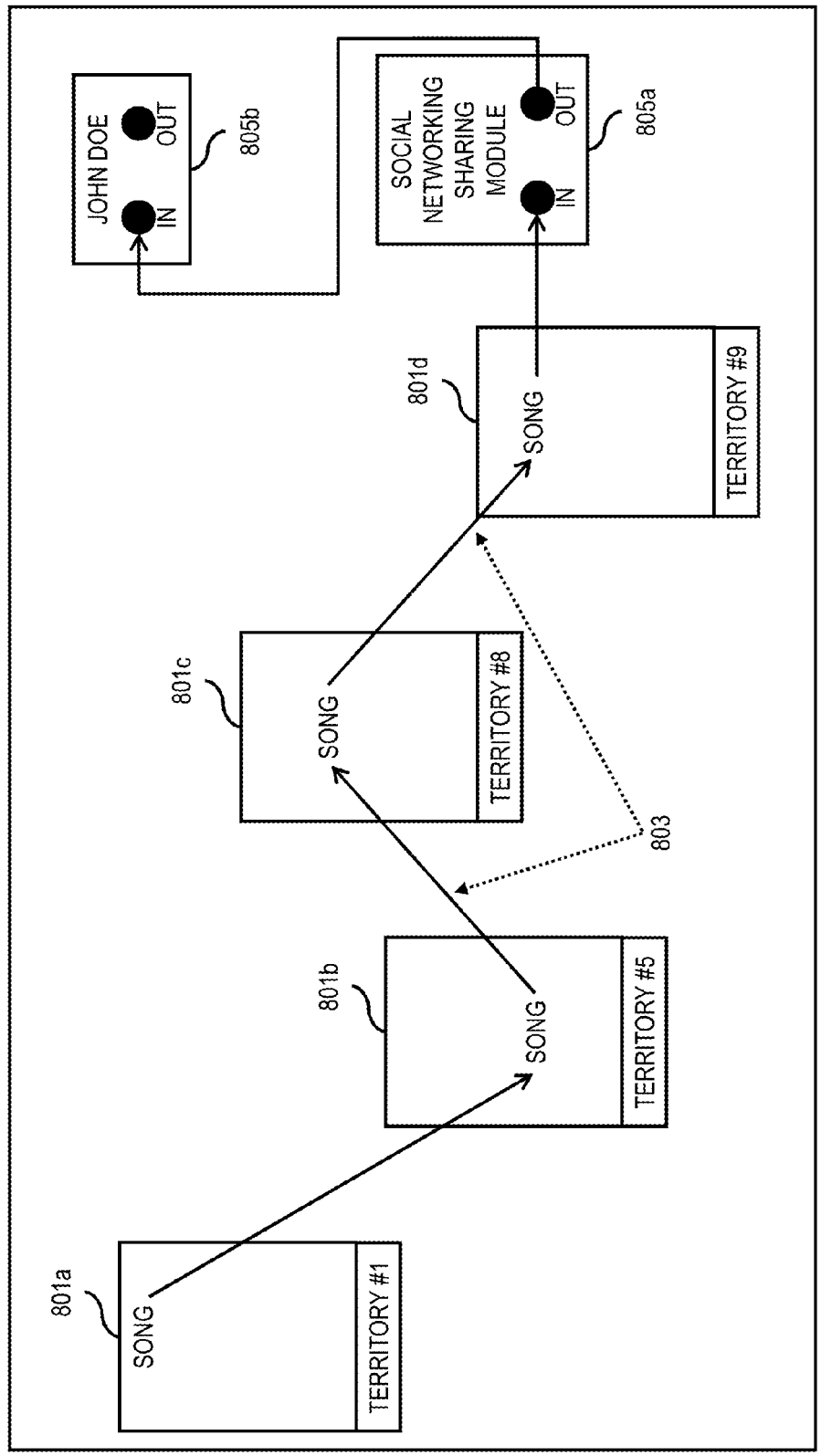
FIG. 8 is a diagram of a user interface for providing mixed content lists and interactions with user interface modules, according to one embodiment.

FIG. 8 is a diagram of a user interface for providing mixed content lists and interactions with user interface modules, according to one embodiment. As illustrated, the user interface 800 depicts location-based content lists 801a-801d that are associated with respective territories 1, 5, 8, and 9. By way of example, the location-based content lists 801a-801d may respectively include songs that users in territories 1, 5, 8, and 9 listen to. In addition, the user interface 800 depicts virtual patch cables 803 and user interface modules 805a and 805b. As shown, the user has patched together a chain that includes a topmost song from the location-based content list 801a along with non-topmost songs from each of the location-based content lists 801b-801d using the virtual patch cables 803. As a result, a new mixed playlist that includes songs from the location-based content lists 801a-801d may have been created. Furthermore, the user has patched the chain of songs to the user interface module 805a, and the user interface module 805a to the user interface module 805b. Consequently, the mixed playlist may be shared to the user's friend, "John Doe," via a social networking service (e.g., associated with the user interface module 805a).

Figure 9:
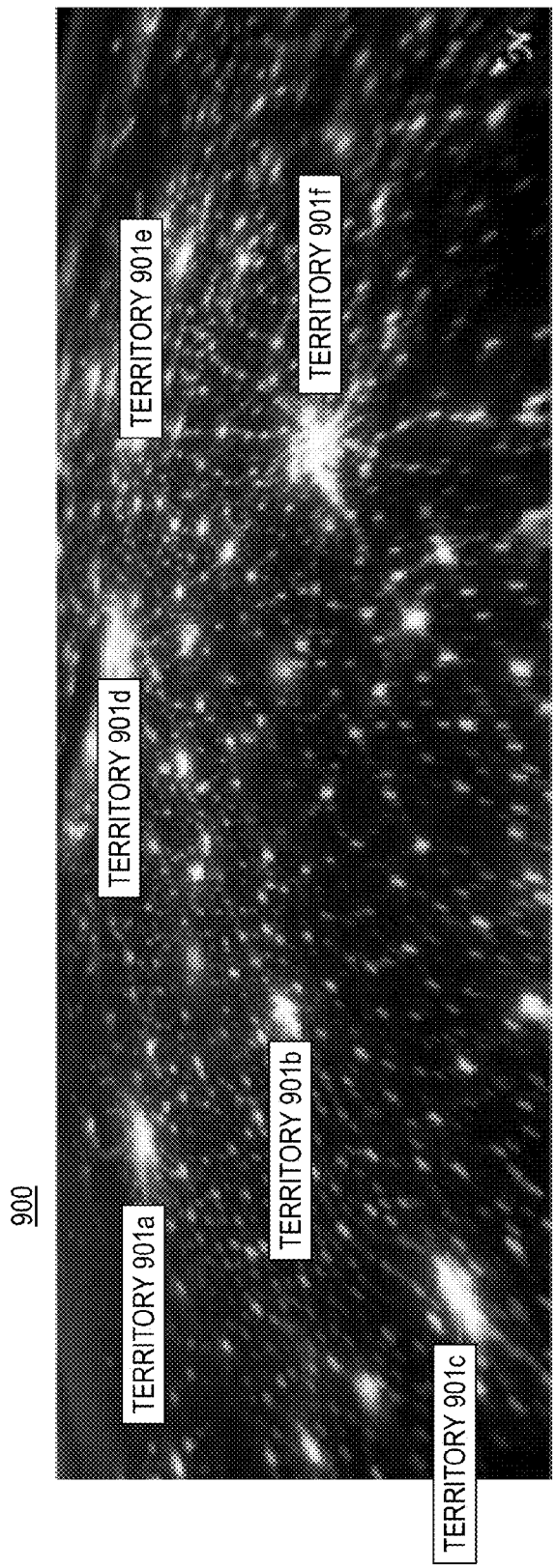
FIG. 9 is a rendering of a map with indicators representing location-based consumptions, according to one embodiment.

FIG. 9 is a rendering of a map with indicators representing location-based consumptions, according to one embodiment. As shown, user interface 900 includes a map featuring one or more territories including territories 901a-901f. In this scenario, the more music that is being listened through a particular territory, the brighter that territory may glow on the map. As illustrated, territory 901a does not shine as brightly as territory 901f. This may, for instance, be because there is more music currently being played in territory 901f than territory 901a. In addition, other indicators (e.g., other than brightness) may be utilized to demonstrate consumption of content items in the various territories. For example, certain colors may be associated with particular music genres. Thus, in another scenario, the user interface 900 may color the territories based on the different music genres that are currently dominating (e.g., most frequently played genres, highest rated genres of those genres played, etc.) the various territories. In this way, real-time indications with respect to popularity of music, genres, songs, etc., may be provided.

The processes described herein for providing content lists using connecting user interface elements may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 10:
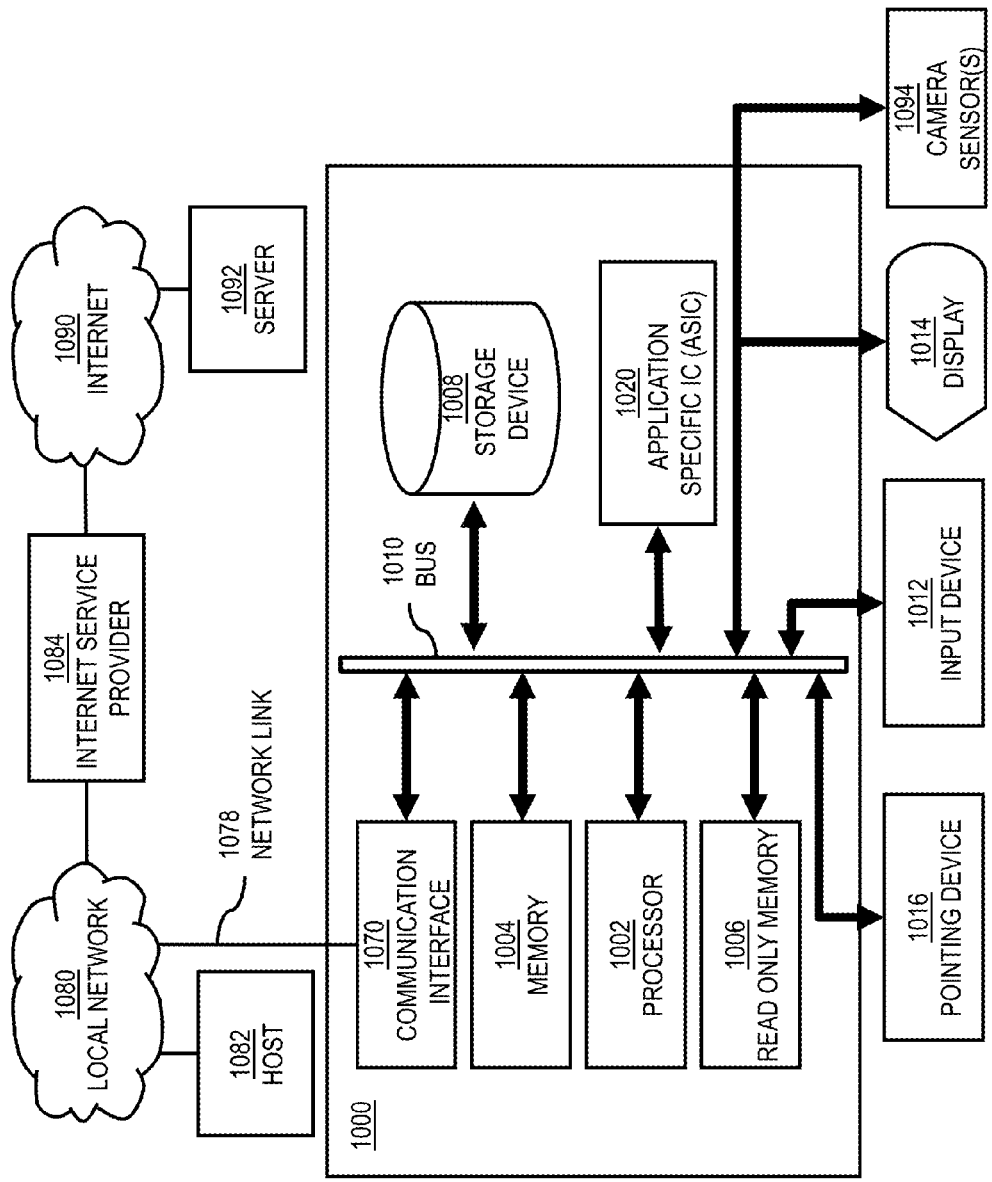
FIG. 10 is a diagram of hardware that can be used to implement an embodiment of the invention.

FIG. 10 illustrates a computer system 1000 upon which an embodiment of the invention may be implemented. Although computer system 1000 is depicted with respect to a particular device or equipment, it is contemplated that other devices or equipment (e.g., network elements, servers, etc.) within FIG. 10 can deploy the illustrated hardware and components of system 1000. Computer system 1000 is programmed (e.g., via computer program code or instructions) to provide content lists using connecting user interface elements as described herein and includes a communication mechanism such as a bus 1010 for passing information between other internal and external components of the computer system 1000. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 1000, or a portion thereof, constitutes a means for performing one or more steps of providing content lists using connecting user interface elements.

A bus 1010 includes one or more parallel conductors of information so that information is transferred quickly among devices coupled to the bus 1010. One or more processors 1002 for processing information are coupled with the bus 1010.

A processor (or multiple processors) 1002 performs a set of operations on information as specified by computer program code related to providing content lists using connecting user interface elements. The computer program code is a set of instructions or statements providing instructions for the operation of the processor and/or the computer system to perform specified functions. The code, for example, may be written in a computer programming language that is compiled into a native instruction set of the processor. The code may also be written directly using the native instruction set (e.g., machine language). The set of operations include bringing information in from the bus 1010 and placing information on the bus 1010. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 1002, such as a sequence of operation codes, constitute processor instructions, also called computer system instructions or, simply, computer instructions. Processors may be implemented as mechanical, electrical, magnetic, optical, chemical, or quantum components, among others, alone or in combination.

Computer system 1000 also includes a memory 1004 coupled to bus 1010. The memory 1004, such as a random access memory (RAM) or any other dynamic storage device, stores information including processor instructions for providing content lists using connecting user interface elements. Dynamic memory allows information stored therein to be changed by the computer system 1000. RAM allows a unit of information stored at a location called a memory address to be stored and retrieved independently of information at neighboring addresses. The memory 1004 is also used by the processor 1002 to store temporary values during execution of processor instructions. The computer system 1000 also includes a read only memory (ROM) 1006 or any other static storage device coupled to the bus 1010 for storing static information, including instructions, that is not changed by the computer system 1000. Some memory is composed of volatile storage that loses the information stored thereon when power is lost. Also coupled to bus 1010 is a non-volatile (persistent) storage device 1008, such as a magnetic disk, optical disk or flash card, for storing information, including instructions, that persists even when the computer system 1000 is turned off or otherwise loses power.

Information, including instructions for providing content lists using connecting user interface elements, is provided to the bus 1010 for use by the processor from an external input device 1012, such as a keyboard containing alphanumeric keys operated by a human user, a microphone, an Infrared (IR) remote control, a joystick, a game pad, a stylus pen, a touch screen, or a sensor. A sensor detects conditions in its vicinity and transforms those detections into physical expression compatible with the measurable phenomenon used to represent information in computer system 1000. Other external devices coupled to bus 1010, used primarily for interacting with humans, include a display device 1014, such as a cathode ray tube (CRT), a liquid crystal display (LCD), a light emitting diode (LED) display, an organic LED (OLED) display, a plasma screen, or a printer for presenting text or images, and a pointing device 1016, such as a mouse, a trackball, cursor direction keys, or a motion sensor, for controlling a position of a small cursor image presented on the display 1014 and issuing commands associated with graphical elements presented on the display 1014, and one or more camera sensors 1094 for capturing, recording and causing to store one or more still and/or moving images (e.g., videos, movies, etc.) which also may comprise audio recordings. In some embodiments, for example, in embodiments in which the computer system 1000 performs all functions automatically without human input, one or more of external input device 1012, display device 1014 and pointing device 1016 may be omitted.

In the illustrated embodiment, special purpose hardware, such as an application specific integrated circuit (ASIC) 1020, is coupled to bus 1010. The special purpose hardware is configured to perform operations not performed by processor 1002 quickly enough for special purposes. Examples of ASICs include graphics accelerator cards for generating images for display 1014, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 1000 also includes one or more instances of a communications interface 1070 coupled to bus 1010. Communication interface 1070 provides a one-way or two-way communication coupling to a variety of external devices that operate with their own processors, such as printers, scanners and external disks. In general the coupling is with a network link 1078 that is connected to a local network 1080 to which a variety of external devices with their own processors are connected. For example, communication interface 1070 may be a parallel port or a serial port or a universal serial bus (USB) port on a personal computer. In some embodiments, communications interface 1070 is an integrated services digital network (ISDN) card or a digital subscriber line (DSL) card or a telephone modem that provides an information communication connection to a corresponding type of telephone line. In some embodiments, a communication interface 1070 is a cable modem that converts signals on bus 1010 into signals for a communication connection over a coaxial cable or into optical signals for a communication connection over a fiber optic cable. As another example, communications interface 1070 may be a local area network (LAN) card to provide a data communication connection to a compatible LAN, such as Ethernet. Wireless links may also be implemented. For wireless links, the communications interface 1070 sends or receives or both sends and receives electrical, acoustic or electromagnetic signals, including infrared and optical signals, that carry information streams, such as digital data. For example, in wireless handheld devices, such as mobile telephones like cell phones, the communications interface 1070 includes a radio band electromagnetic transmitter and receiver called a radio transceiver. In certain embodiments, the communications interface 1070 enables connection to the communication network 105 for providing content lists using connecting user interface elements to the UE 101.

The term "computer-readable medium" as used herein refers to any medium that participates in providing information to processor 1002, including instructions for execution. Such a medium may take many forms, including, but not limited to computer-readable storage medium (e.g., non-volatile media, volatile media), and transmission media. Non-transitory media, such as non-volatile media, include, for example, optical or magnetic disks, such as storage device 1008. Volatile media include, for example, dynamic memory 1004. Transmission media include, for example, twisted pair cables, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, a carrier wave, or any other medium from which a computer can read. The term computer-readable storage medium is used herein to refer to any computer-readable medium except transmission media.

Logic encoded in one or more tangible media includes one or both of processor instructions on a computer-readable storage media and special purpose hardware, such as ASIC 1020.

Network link 1078 typically provides information communication using transmission media through one or more networks to other devices that use or process the information. For example, network link 1078 may provide a connection through local network 1080 to a host computer 1082 or to equipment 1084 operated by an Internet Service Provider (ISP). ISP equipment 1084 in turn provides data communication services through the public, world-wide packet-switching communication network of networks now commonly referred to as the Internet 1090.

A computer called a server host 1092 connected to the Internet hosts a process that provides a service in response to information received over the Internet. For example, server host 1092 hosts a process that provides information representing video data for presentation at display 1014. It is contemplated that the components of system 1000 can be deployed in various configurations within other computer systems, e.g., host 1082 and server 1092.

At least some embodiments of the invention are related to the use of computer system 1000 for implementing some or all of the techniques described herein. According to one embodiment of the invention, those techniques are performed by computer system 1000 in response to processor 1002 executing one or more sequences of one or more processor instructions contained in memory 1004. Such instructions, also called computer instructions, software and program code, may be read into memory 1004 from another computer-readable medium such as storage device 1008 or network link 1078. Execution of the sequences of instructions contained in memory 1004 causes processor 1002 to perform one or more of the method steps described herein. In alternative embodiments, hardware, such as ASIC 1020, may be used in place of or in combination with software to implement the invention. Thus, embodiments of the invention are not limited to any specific combination of hardware and software, unless otherwise explicitly stated herein.

The signals transmitted over network link 1078 and other networks through communications interface 1070, carry information to and from computer system 1000. Computer system 1000 can send and receive information, including program code, through the networks 1080, 1090 among others, through network link 1078 and communications interface 1070. In an example using the Internet 1090, a server host 1092 transmits program code for a particular application, requested by a message sent from computer 1000, through Internet 1090, ISP equipment 1084, local network 1080 and communications interface 1070. The received code may be executed by processor 1002 as it is received, or may be stored in memory 1004 or in storage device 1008 or any other non-volatile storage for later execution, or both. In this manner, computer system 1000 may obtain application program code in the form of signals on a carrier wave.

Various forms of computer readable media may be involved in carrying one or more sequence of instructions or data or both to processor 1002 for execution. For example, instructions and data may initially be carried on a magnetic disk of a remote computer such as host 1082. The remote computer loads the instructions and data into its dynamic memory and sends the instructions and data over a telephone line using a modem. A modem local to the computer system 1000 receives the instructions and data on a telephone line and uses an infra-red transmitter to convert the instructions and data to a signal on an infra-red carrier wave serving as the network link 1078. An infrared detector serving as communications interface 1070 receives the instructions and data carried in the infrared signal and places information representing the instructions and data onto bus 1010. Bus 1010 carries the information to memory 1004 from which processor 1002 retrieves and executes the instructions using some of the data sent with the instructions. The instructions and data received in memory 1004 may optionally be stored on storage device 1008, either before or after execution by the processor 1002.

FIG. 11 illustrates a chip set or chip 1100 upon which an embodiment of the invention may be implemented. Chip set 1100 is programmed to provide content lists using connecting user interface elements as described herein and includes, for instance, the processor and memory components described with respect to FIG. 10 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 1100 can be implemented in a single chip. It is further contemplated that in certain embodiments the chip set or chip 1100 can be implemented as a single "system on a chip." It is further contemplated that in certain embodiments a separate ASIC would not be used, for example, and that all relevant functions as disclosed herein would be performed by a processor or processors. Chip set or chip 1100, or a portion thereof, constitutes a means for performing one or more steps of providing user interface navigation information associated with the availability of functions. Chip set or chip 1100, or a portion thereof, constitutes a means for performing one or more steps of providing content lists using connecting user interface elements.

In one embodiment, the chip set or chip 1100 includes a communication mechanism such as a bus 1101 for passing information among the components of the chip set 1100. A processor 1103 has connectivity to the bus 1101 to execute instructions and process information stored in, for example, a memory 1105. The processor 1103 may include one or more processing cores with each core configured to perform independently. A multi-core processor enables multiprocessing within a single physical package. Examples of a multi-core processor include two, four, eight, or greater numbers of processing cores. Alternatively or in addition, the processor 1103 may include one or more microprocessors configured in tandem via the bus 1101 to enable independent execution of instructions, pipelining, and multithreading. The processor 1103 may also be accompanied with one or more specialized components to perform certain processing functions and tasks such as one or more digital signal processors (DSP) 1107, or one or more application-specific integrated circuits (ASIC) 1109. A DSP 1107 typically is configured to process real-world signals (e.g., sound) in real time independently of the processor 1103. Similarly, an ASIC 1109 can be configured to performed specialized functions not easily performed by a more general purpose processor. Other specialized components to aid in performing the inventive functions described herein may include one or more field programmable gate arrays (FPGA), one or more controllers, or one or more other special-purpose computer chips.

In one embodiment, the chip set or chip 1100 includes merely one or more processors and some software and/or firmware supporting and/or relating to and/or for the one or more processors.

The processor 1103 and accompanying components have connectivity to the memory 1105 via the bus 1101. The memory 1105 includes both dynamic memory (e.g., RAM, magnetic disk, writable optical disk, etc.) and static memory (e.g., ROM, CD-ROM, etc.) for storing executable instructions that when executed perform the inventive steps described herein to provide content lists using connecting user interface elements. The memory 1105 also stores the data associated with or generated by the execution of the inventive steps.

Figure 12:
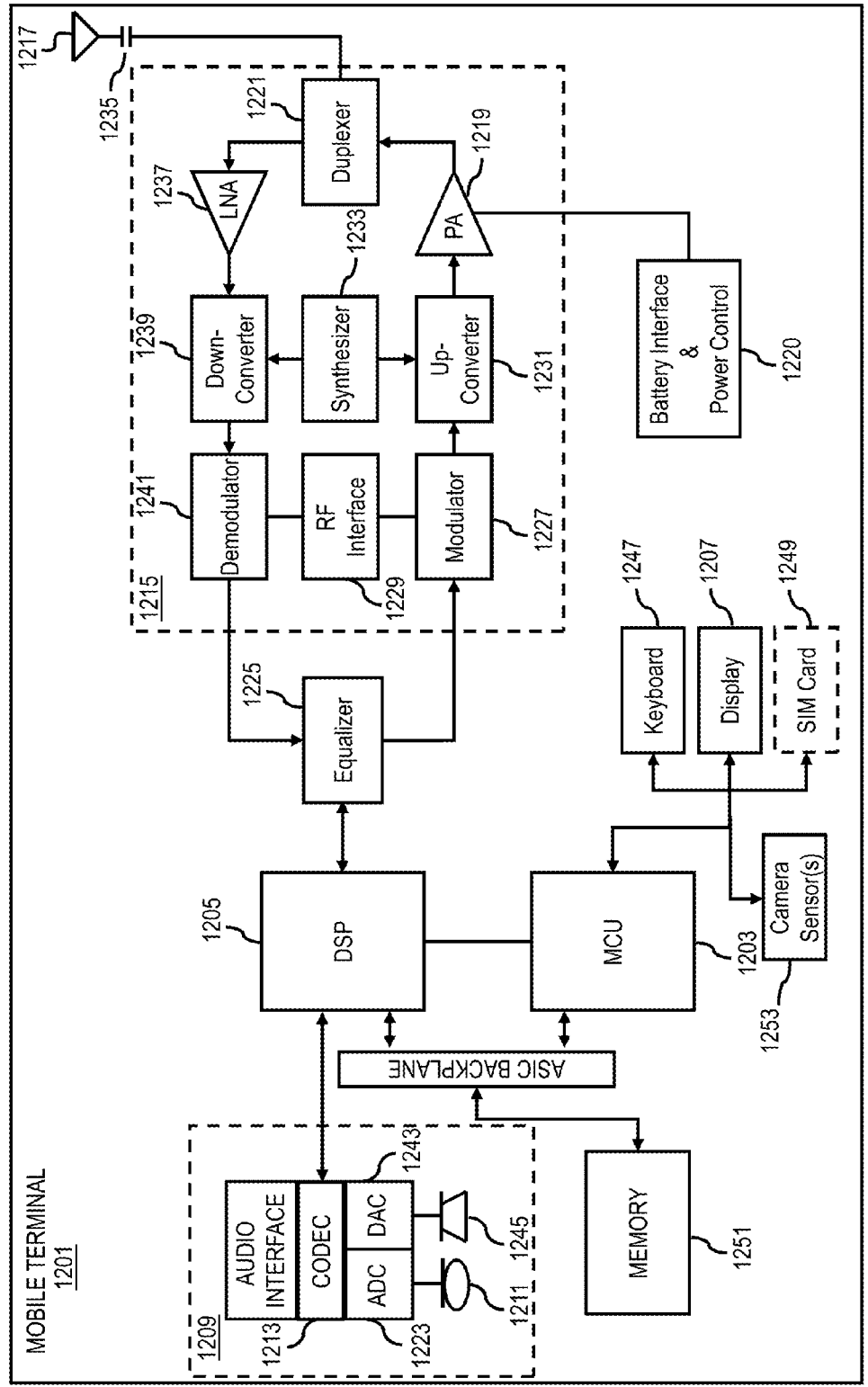
FIG. 12 is a diagram of a mobile terminal (e.g., handset) that can be used to implement an embodiment of the invention.

FIG. 12 is a diagram of exemplary components of a mobile terminal (e.g., handset) for communications, which is capable of operating in the system of FIG. 1, according to one embodiment. In some embodiments, mobile terminal 1201, or a portion thereof, constitutes a means for performing one or more steps of providing content lists using connecting user interface elements. Generally, a radio receiver is often defined in terms of front-end and back-end characteristics. The front-end of the receiver encompasses all of the Radio Frequency (RF) circuitry whereas the back-end encompasses all of the base-band processing circuitry. As used in this application, the term "circuitry" refers to both: (1) hardware-only implementations (such as implementations in only analog and/or digital circuitry), and (2) to combinations of circuitry and software (and/or firmware) (such as, if applicable to the particular context, to a combination of processor(s), including digital signal processor(s), software, and memory(ies) that work together to cause an apparatus, such as a mobile phone or server, to perform various functions). This definition of "circuitry" applies to all uses of this term in this application, including in any claims. As a further example, as used in this application and if applicable to the particular context, the term "circuitry" would also cover an implementation of merely a processor (or multiple processors) and its (or their) accompanying software/or firmware. The term "circuitry" would also cover if applicable to the particular context, for example, a baseband integrated circuit or applications processor integrated circuit in a mobile phone or a similar integrated circuit in a cellular network device or other network devices.

Pertinent internal components of the telephone include a Main Control Unit (MCU) 1203, a Digital Signal Processor (DSP) 1205, and a receiver/transmitter unit including a microphone gain control unit and a speaker gain control unit. A main display unit 1207 provides a display to the user in support of various applications and mobile terminal functions that perform or support the steps of providing content lists using connecting user interface elements. The display 1207 includes display circuitry configured to display at least a portion of a user interface of the mobile terminal (e.g., mobile telephone). Additionally, the display 1207 and display circuitry are configured to facilitate user control of at least some functions of the mobile terminal. An audio function circuitry 1209 includes a microphone 1211 and microphone amplifier that amplifies the speech signal output from the microphone 1211. The amplified speech signal output from the microphone 1211 is fed to a coder/decoder (CODEC) 1213.

A radio section 1215 amplifies power and converts frequency in order to communicate with a base station, which is included in a mobile communication system, via antenna 1217. The power amplifier (PA) 1219 and the transmitter/modulation circuitry are operationally responsive to the MCU 1203, with an output from the PA 1219 coupled to the duplexer 1221 or circulator or antenna switch, as known in the art. The PA 1219 also couples to a battery interface and power control unit 1220.

In use, a user of mobile terminal 1201 speaks into the microphone 1211 and his or her voice along with any detected background noise is converted into an analog voltage. The analog voltage is then converted into a digital signal through the Analog to Digital Converter (ADC) 1223. The control unit 1203 routes the digital signal into the DSP 1205 for processing therein, such as speech encoding, channel encoding, encrypting, and interleaving. In one embodiment, the processed voice signals are encoded, by units not separately shown, using a cellular transmission protocol such as enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., microwave access (WiMAX), Long Term Evolution (LTE) networks, code division multiple access (CDMA), wideband code division multiple access (WCDMA), wireless fidelity (WiFi), satellite, and the like, or any combination thereof.

The encoded signals are then routed to an equalizer 1225 for compensation of any frequency-dependent impairments that occur during transmission though the air such as phase and amplitude distortion. After equalizing the bit stream, the modulator 1227 combines the signal with a RF signal generated in the RF interface 1229. The modulator 1227 generates a sine wave by way of frequency or phase modulation. In order to prepare the signal for transmission, an up-converter 1231 combines the sine wave output from the modulator 1227 with another sine wave generated by a synthesizer 1233 to achieve the desired frequency of transmission. The signal is then sent through a PA 1219 to increase the signal to an appropriate power level. In practical systems, the PA 1219 acts as a variable gain amplifier whose gain is controlled by the DSP 1205 from information received from a network base station. The signal is then filtered within the duplexer 1221 and optionally sent to an antenna coupler 1235 to match impedances to provide maximum power transfer. Finally, the signal is transmitted via antenna 1217 to a local base station. An automatic gain control (AGC) can be supplied to control the gain of the final stages of the receiver. The signals may be forwarded from there to a remote telephone which may be another cellular telephone, any other mobile phone or a land-line connected to a Public Switched Telephone Network (PSTN), or other telephony networks.

Voice signals transmitted to the mobile terminal 1201 are received via antenna 1217 and immediately amplified by a low noise amplifier (LNA) 1237. A down-converter 1239 lowers the carrier frequency while the demodulator 1241 strips away the RF leaving only a digital bit stream. The signal then goes through the equalizer 1225 and is processed by the DSP 1205. A Digital to Analog Converter (DAC) 1243 converts the signal and the resulting output is transmitted to the user through the speaker 1245, all under control of a Main Control Unit (MCU) 1203 which can be implemented as a Central Processing Unit (CPU).

The MCU 1203 receives various signals including input signals from the keyboard 1247. The keyboard 1247 and/or the MCU 1203 in combination with other user input components (e.g., the microphone 1211) comprise a user interface circuitry for managing user input. The MCU 1203 runs a user interface software to facilitate user control of at least some functions of the mobile terminal 1201 to provide content lists using connecting user interface elements. The MCU 1203 also delivers a display command and a switch command to the display 1207 and to the speech output switching controller, respectively. Further, the MCU 1203 exchanges information with the DSP 1205 and can access an optionally incorporated SIM card 1249 and a memory 1251. In addition, the MCU 1203 executes various control functions required of the terminal. The DSP 1205 may, depending upon the implementation, perform any of a variety of conventional digital processing functions on the voice signals. Additionally, DSP 1205 determines the background noise level of the local environment from the signals detected by microphone 1211 and sets the gain of microphone 1211 to a level selected to compensate for the natural tendency of the user of the mobile terminal 1201.

The CODEC 1213 includes the ADC 1223 and DAC 1243. The memory 1251 stores various data including call incoming tone data and is capable of storing other data including music data received via, e.g., the global Internet. The software module could reside in RAM memory, flash memory, registers, or any other form of writable storage medium known in the art. The memory device 1251 may be, but not limited to, a single memory, CD, DVD, ROM, RAM, EEPROM, optical storage, magnetic disk storage, flash memory storage, or any other non-volatile storage medium capable of storing digital data.

An optionally incorporated SIM card 1249 carries, for instance, important information, such as the cellular phone number, the carrier supplying service, subscription details, and security information. The SIM card 1249 serves primarily to identify the mobile terminal 1201 on a radio network. The card 1249 also contains a memory for storing a personal telephone number registry, text messages, and user specific mobile terminal settings.

Further, one or more camera sensors 1253 may be incorporated onto the mobile station 1201 wherein the one or more camera sensors may be placed at one or more locations on the mobile station. Generally, the camera sensors may be utilized to capture, record, and cause to store one or more still and/or moving images (e.g., videos, movies, etc.) which also may comprise audio recordings.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A method comprising:

rendering, at a user device, a user interface depicting at least one location-based content list and at least one other location-based content list at one or more corresponding locations in a map, wherein each respective content list is associated with a respective location, wherein consumption location and route information associated with each media content item in the location-based content list and the at least one other location-based content list is graphically depicted on the map;

receiving, at the user device, one or more user interactions with a connecting user interface element to cause, at least in part, a presentation of an association of the at least one location-based content list with the at least one other location-based content list in the map on the user interface, wherein the connecting user interface element is a separate user interface element from the at least one location-based content list and the at least one other location-based content list;

creating, at the user device, at least one mixed content list made from the at least one location-based content list and the at least one other location-based content list based, at least in part, on the association, wherein the at least one mixed content list includes linking identifiers of media content files that link to one or more databases; and retrieving, by the user device, the media content files from the one or more databases using the linking identifiers, while rendering one of the media content files and transitioning to the next one of the media content files at the user device by applying a synchronization module as well as concurrently transmitting application information of the synchronization module to one or more other user devices, wherein the one or more other user devices follow the rendering on the user device by retrieving the media content files from the one or more databases and transitioning to the next one of the media content files using the application information of the synchronization module.

2. A method of claim 1, further comprising:
transmitting the at least one mixed content list to the one or more other user devices, or publishing the at least one mixed content list on one or more social network websites accessible to the one or more other user devices;
determining at least one territory associated with the at least one location-based content list based, at least in part, on the consumption location and route information associated with each media content item in the content list;
determining one or more subsequent consumptions location and route information associated with one or more other content items in the territory; and
modifying the at least one location-based content list with the one or more other content items based, at least in part, on the subsequent consumptions location and route information,
wherein the linking identifiers of media content files are combined into a link vector.

3. A method of claim 2, further comprising:
determining conquest of the at least one territory based, at least in part, on a determination that subsequent consumptions of the one or more other content items exceed consumptions of the one or more content items within the at least one territory with respect to consumption time durations and consumption routing coverage; and
determining, based on the conquest, an addition of one or more credits to one or more users performing the subsequent consumptions of the one or more other content items,
wherein the linking identifiers of the media content files are uniform resource identifiers.

4. A method of claim 2, further comprising:
rendering in the map one or more indicators representing the consumptions of the one or more content items, the subsequent consumptions of the one or more other content items, or a combination thereof,
wherein the synchronization module is a beat matching module.

5. A method of claim 4, wherein one or more characteristics of the one or more indicators are based, at least in part, on respective consumption amounts of the one or more content items, the one or more other content items, or a combination thereof, and
wherein the beat matching module analyzes beats and downbeats of content signals in the media content files and then either applies time stretching to match tempi of the content signals during a transition period, or time-aligns the content signals to match the beats and the downbeats during the transition period.

6. A method of claim 2, further comprising:
rendering one or more user interface modules; and
determining one or more other interactions among at least one other connecting user interface element and the one or more user interface modules to cause, at least in part, one or more actions with respect to the at least one mixed content list.

7. A method of claim 6, further comprising:
initiating a transfer of the at least one mixed content list, one or more media files associated with the at least one mixed content list, content information associated with the at least one mixed content list, or a combination thereof to one or more devices, one or more services, or a combination thereof in response to the one or more other interactions.

8. A method of claim 6, further comprising:
modifying the at least one mixed content list, one or more media files associated with the at least one mixed content list, content information associated with the at least one mixed content list, or a combination thereof in response to the one or more other interactions.

9. A method of claim 6, further comprising:
rendering one or more input connection components, one or more output connection components, or a combination thereof for interacting with the at least one connecting user interface element, the at least one other connecting user interface element, the at least one location-based content list, the at least one other location-based content list, the at least one mixed content list, the one or more user interface modules, or a combination thereof.

10. A method of claim 9, wherein the one or more interactions, the one or more other interactions, or a combination thereof includes, at least in part, a connecting of at least one of the one or more input connection components to at least one of the one or more output connection components using the at least one connecting user interface element, the at least one other connecting user interface element, or a combination thereof.

11. An apparatus comprising:
at least one processor; and
at least one memory including computer program code for one or more programs,
the at least one memory and the computer program code configured to, with the at least one processor, cause the apparatus embedded in a user device to perform at least the following,
initiate a rendering of a user interface depicting at least one location-based content list and at least one other location-based content list at one or more corresponding locations in a map, wherein each respective content list is associated with a respective location, wherein consumption location and route information associated with each media content item in the location-based content list and the at least one other location-based content list is graphically depicted on the map;
receive one or more user interactions with a connecting user interface element to cause, at least in part, a presentation of an association of the at least one location-based content list with the at least one other location-based content list in the map on the user interface, wherein the connecting user interface element is a separate user interface element from the at least one location-based content list and the at least one other location-based content list;
create at least one mixed content list made from the at least one location-based content list and the at least one other location-based content list based, at least in part, on the association, wherein the at least one mixed content list includes linking identifiers of media content files that link to one or more databases; and
retrieve the media content files from the one or more databases using the linking identifiers, while rendering one of the media content files and transitioning to the next one of the media content files by applying a synchronization module as well as concurrently transmitting application information of the synchronization module to one or more other user devices,
wherein the one or more other user devices follow the rendering on the user device by retrieving the media content files from the one or more databases and transitioning to the next one of the media content files using the application information of the synchronization module.

12. An apparatus of claim 11, wherein the apparatus is further caused to:
determine at least one territory associated with the at least one location-based content list based, at least in part, on the consumption location and route information associated with each media content item in the content list;
determine one or more subsequent consumptions location and route information associated with one or more other content items in the territory; and
modify the at least one location-based content list with the one or more other content items based, at least in part, on the subsequent consumptions location and route information.

13. An apparatus of claim 12, wherein the apparatus is further caused to:
determine conquest of the at least one territory based, at least in part, on a determination that subsequent consumptions of the one or more other content items exceed consumptions of the one or more content items within the at least one territory with respect to consumption time durations and consumption routing coverage; and
determine, based on the conquest, an addition of one or more credits to one or more users performing the subsequent consumptions of the one or more other content items.

14. An apparatus of claim 12, wherein the apparatus is further caused to:
initiate a rendering in the map one or more indicators representing the consumptions of the one or more content items, the subsequent consumptions of the one or more other content items, or a combination thereof.

15. An apparatus of claim 14, wherein one or more characteristics of the one or more indicators are based, at least in part, on respective consumption amounts of the one or more content items, the one or more other content items, or a combination thereof.

16. An apparatus of claim 12, wherein the apparatus is further caused to:
initiate a rendering of one or more user interface modules; and
determine one or more other interactions among at least one other connecting user interface element and the one or more user interface modules to cause, at least in part, one or more actions with respect to the at least one mixed content list.

17. An apparatus of claim 16, wherein the apparatus is further caused to:
initiate a transfer of the at least one mixed content list, one or more media files associated with the at least one mixed content list, content information associated with the at least one mixed content list, or a combination thereof to one or more devices, one or more services, or a combination thereof in response to the one or more other interactions.

18. An apparatus of claim 16, wherein the apparatus is further caused to:
modify the at least one mixed content list, one or more media files associated with the at least one mixed content list, content information associated with the at least one mixed content list, or a combination thereof in response to the one or more interactions.

19. An apparatus of claim 16, wherein the apparatus is further caused to:
initiate a rendering of one or more input connection components, one or more output connection components, or a combination thereof for interacting with the at least one connecting user interface element, the at least one other connecting user interface element, the at least one location-based content list, the at least one other location-based content list, the at least one mixed content list, the one or more user interface modules, or a combination thereof.

20. An apparatus of claim 19, wherein the one or more interactions, the one or more other interactions, or a combination thereof includes, at least in part, a connecting of at least one of the one or more input connection components to at least one of the one or more output connection components using the at least one connecting user interface element, the at least one other connecting user interface element, or a combination thereof.

* * * * *